US012721062B2

(12) United States Patent
Li et al.

(10) Patent No.: US 12,721,062 B2
(45) Date of Patent: Aug. 25, 2026

(54) METHODS TO IMPROVE OXIDE SIDEWALL QUALITY

(71) Applicant: Applied Materials, Inc., Santa Clara, CA (US)

(72) Inventors: Tianyang Li, San Jose, CA (US); Hang Yu, San Jose, CA (US); Rui Cheng, San Jose, CA (US); Deenesh Padhi, Saratoga, CA (US); Woongsik Nam, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 372 days.

(21) Appl. No.: 18/485,172

(22) Filed: Oct. 11, 2023

(65) Prior Publication Data

US 2025/0125145 A1 Apr. 17, 2025

(51) Int. Cl.

*H10P 14/60* (2026.01)
*H01J 37/32* (2006.01)
*H10P 14/692* (2026.01)

(52) U.S. Cl.

CPC .... *H10P 14/6336* (2026.01); *H01J 37/32449* (2013.01); *H01J 37/32522* (2013.01); *H10P 14/6518* (2026.01); *H10P 14/6532* (2026.01); *H10P 14/6682* (2026.01); *H10P 14/69215* (2026.01); *H01J 2237/332* (2013.01)

(58) Field of Classification Search

CPC ......... H01L 21/02274; H01L 21/02164; H01L 21/02211; H01L 21/02321; H01L 21/0234; H01J 37/32449; H01J 37/32522; H01J 2237/332

See application file for complete search history.

(56) References Cited

U.S. PATENT DOCUMENTS 6,537,896 B1 * 3/2003 Catabay ............ H01L 21/76831 257/E21.273
2005/0266622 A1 * 12/2005 Arghavani ........ H01L 21/02164 257/E21.279
2010/0078690 A1 * 4/2010 Sugiyama ......... H01L 21/31055 257/E21.585

(Continued)

FOREIGN PATENT DOCUMENTS

WO 2023114641 A1 6/2023

OTHER PUBLICATIONS

PCT/US2024/050116, "International Search Report and Written Opinion", Jan. 17, 2025, 11 pages.

*Primary Examiner* — Binh X Tran
*Assistant Examiner* — Christopher Remavege
(74) *Attorney, Agent, or Firm* — Kilpatrick Townsend & Stockton LLP

(57) ABSTRACT

Exemplary methods of forming a silicon-containing material may include providing a silicon-containing precursor to a processing region of a semiconductor processing chamber. A substrate may be housed within the processing region of the semiconductor processing chamber and include one or more features. The methods may include generating plasma effluents of the silicon-containing precursor in the processing region. The methods may include depositing a silicon-containing material on a vertically extending portion and a horizontally extending portion of the feature. Methods include soaking the deposited silicon-containing material with a second silicon-containing material.

19 Claims, 5 Drawing Sheets

(56) References Cited

U.S. PATENT DOCUMENTS

| | | | | |
|---|---|---|---|---|
| 2012/0164829 | A1* | 6/2012 | Rajagopalan | H10P 70/277 438/675 |
| 2016/0276148 | A1* | 9/2016 | Qian | C23C 16/02 |
| 2017/0076955 | A1 | 3/2017 | Hudson et al. | |
| 2017/0372919 | A1* | 12/2017 | Manna | H01L 21/02164 |
| 2018/0151346 | A1 | 5/2018 | Blanquart | |
| 2018/0350668 | A1* | 12/2018 | Cheng | C23C 16/24 |
| 2019/0067107 | A1 | 2/2019 | Yu et al. | |
| 2019/0157387 | A1* | 5/2019 | Wu | H10D 62/115 |
| 2020/0411371 | A1* | 12/2020 | Liu | C23C 16/56 |
| 2021/0159073 | A1* | 5/2021 | Mutyala | H01L 21/6831 |
| 2022/0084815 | A1* | 3/2022 | Xie | H01J 37/32724 |
| 2023/0051200 | A1* | 2/2023 | Zhao | C23C 16/50 |
| 2023/0112490 | A1* | 4/2023 | Kengoyama | H01L 21/02274 438/737 |
| 2023/0143580 | A1* | 5/2023 | Kuroda | H01L 21/31116 438/789 |

* cited by examiner

METHODS TO IMPROVE OXIDE SIDEWALL QUALITY

TECHNICAL FIELD

The present technology relates to deposition processes and chambers. More specifically, the present technology relates to methods of producing silicon-containing materials with increased film quality.

BACKGROUND

Integrated circuits are made possible by processes which produce intricately patterned material layers on substrate surfaces. Producing patterned material on a substrate requires controlled methods for forming and removing material. Material characteristics may affect how the device operates, and may also affect how the films are removed relative to one another. Plasma-enhanced deposition may produce films having certain characteristics. Many films that are formed require additional processing to adjust or enhance the material characteristics of the film in order to provide suitable properties.

Thus, there is a need for improved systems and methods that can be used to produce high quality devices and structures. These and other needs are addressed by the present technology.

SUMMARY

The present technology is generally directed to semiconductor processing methods and semiconductor structures. Methods include providing a silicon-containing precursor to a processing region of a semiconductor processing chamber, where a substrate including one or more features is housed within the processing region of the semiconductor processing chamber. Methods include generating plasma effluents of the silicon-containing precursor in the processing region. Methods include depositing a silicon-containing material on a vertically extending portion of the one or more features and a horizontally extending portion of the one or more features. Methods include soaking the silicon-containing material with a second silicon-containing precursor.

In embodiments, the second silicon-containing precursor includes silane ($SiH_4$), disilane ($Si_2H_6$), trisilane ($Si_3H_8$), silicon tetrachloride ($SiCl_4$), tetraethyl orthosilicate (TEOS), trisillylamine (TSA), octadecylcyclotetraoxane (OMTCS), tetramethylsilane (TMS), methyldiethoxysilane (DEMS), dimethyldimethoxysilane (DMDMOS), or a combination thereof. In more embodiments, the soaking occurs for a time sufficient to increase an atomic percentage of silicon in the vertically extending portion of the silicon-containing material by greater than or about 0.5%. Further, in embodiments, the soaking occurs for a time sufficient to increase an atomic percentage of silicon in the vertically extending portion of the silicon-containing material by greater than or about 2.5%. Additionally or alternatively, in embodiments a temperature in the semiconductor processing chamber is maintained at greater than or about 360° C. during the soaking. Moreover, in embodiments the temperature in the semiconductor processing chamber is maintained about 380° C. to about 500° C. during the soaking. In embodiments, a pressure in the semiconductor processing chamber is maintained at a pressure of from about 5 torr to about 350 torr during the soaking. In yet more embodiments, the soaking is performed for about 5 minutes to about 40 minutes. In further embodiments, a void percentage in the film, based upon a total film volume, is decreased by greater than or about 5 vol. % after soaking. Embodiments include where the vertically extending portion includes a first etch rate and the horizontally extending portion comprises a second etch rate, where the first etch rate is less than or about 10% higher than the second etch rate after soaking. In embodiments, the first etch rate and the second etch rate are wet etch rates.

The present technology is also generally directed to semiconductor processing methods. Methods include providing a silicon-containing precursor to a processing region of a semiconductor processing chamber, where a substrate having one or more features is housed within the processing region of the semiconductor processing chamber. Methods include generating plasma effluents of the silicon-containing precursor in the processing region. Methods include depositing a silicon-containing material on a vertically extending portion of the one or more features and a horizontally extending portion of the one or more features. Methods include providing plasma effluents of a second silicon-containing precursor in the processing region, increasing an atomic percentage of silicon in the vertically extending portion of the silicon-containing material by greater than or about 0.5%.

In embodiments, the silicon-containing material is deposited on the horizontally extending portion, the vertically extending portion, or both, at a thickness of less than or about 10 micrometers. In more embodiments, a temperature in the semiconductor processing chamber is maintained about 380° C. to about 500° C. when providing plasma effluents of the second silicon-containing precursor. Furthermore, in embodiments, a pressure in the semiconductor processing chamber is maintained at a pressure of from about 5 torr to about 350 torr when providing plasma effluents of the second silicon-containing precursor. Additionally or alternatively, methods include where providing plasma effluents of the second silicon-containing precursor is performed for about 5 minutes to about 40 minutes. In embodiments, methods include etching the substrate after providing plasma effluents of the second silicon-containing precursor.

The present technology is also generally directed to semiconductor processing methods. Methods include providing a silicon-containing precursor to a processing region of a semiconductor processing chamber, where a substrate including one or more features is housed within the processing region of the semiconductor processing chamber. Methods include generating plasma effluents of the silicon-containing precursor in the processing region. Methods include depositing a silicon-containing material on a vertically extending portion of the one or more features and a horizontally extending portion of the one or more features. Methods include providing plasma effluents of a second silicon-containing precursor in the processing region at a temperature of about 380° C. to about 500° C., a pressure of from about 5 torr to about 350 torr, a time of about 5 minutes to about 40 minutes, or a combination thereof. Methods include soaking the silicon-containing material with a second silicon-containing precursor, increasing an atomic percentage of silicon in the vertically extending portion of the silicon-containing material by greater than or about 0.5%.

Embodiments include where the silicon-containing material is deposited on the horizontally extending portion, the vertically extending portion, or both, at a thickness of less than or about 10 micrometers. In more embodiments, the second silicon-containing precursor includes silane ($SiH_4$), disilane ($Si_2H_6$), trisilane ($Si_3H_8$), silicon tetrachloride ($SiCl_4$), tetraethyl orthosilicate (TEOS), trisillylamine (TSA), octadecylcyclotetraoxane (OMTCS), tetramethylsilane (TMS), methyldiethoxysilane (DEMS), dimethyldimethoxysilane (DMDMOS), or a combination thereof.

Such technology may provide numerous benefits over conventional systems and techniques. For example, the present technology may provide for improved crosslinking or bonding along a vertically extending portion of a deposited film, allowing for improved film quality on one or more vertical portions of a feature. Additionally, due to improvements in film quality, an etch rate of the vertically extending film portion may be decreased, and reduced instances of seams and voids may be exhibited. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
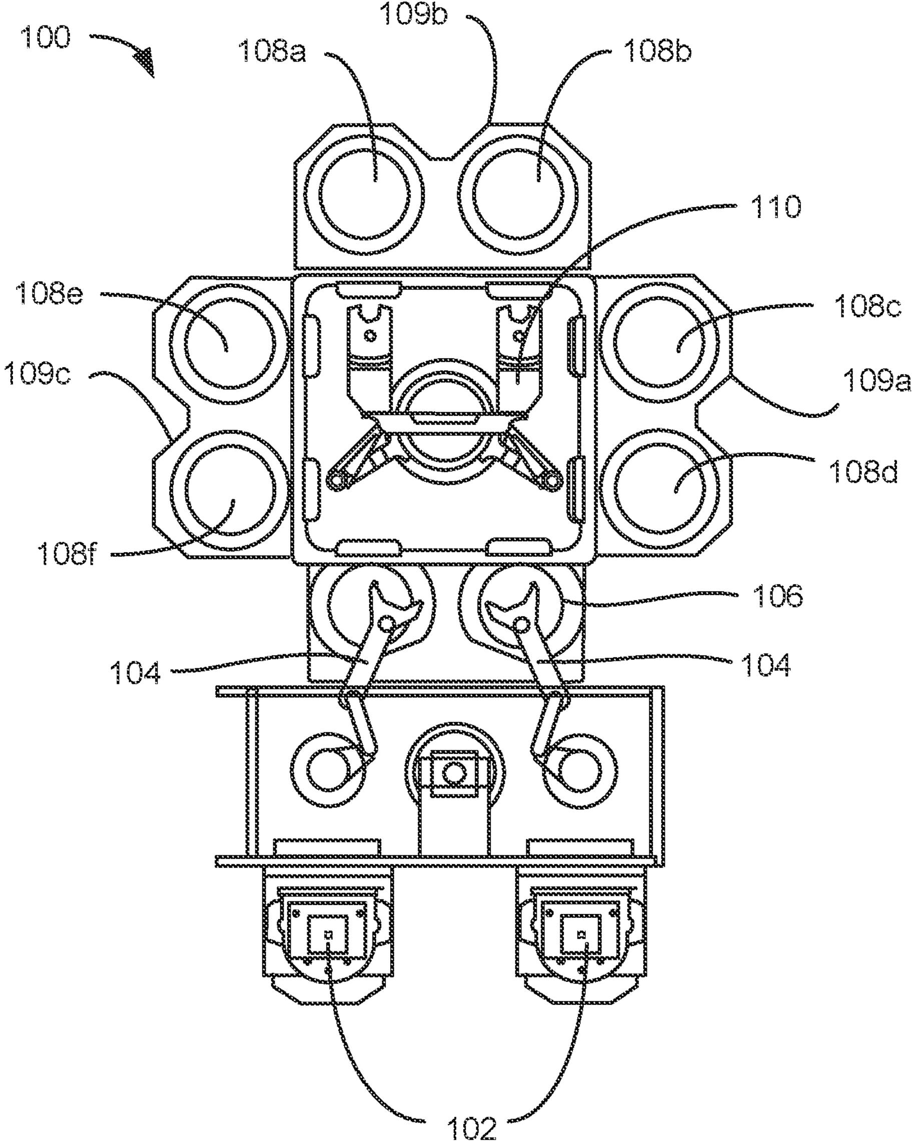
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During semiconductor processing, materials may be deposited for gapfill operations, such as for staircase fill in 3D NAND applications. These materials may be deposited through plasma-enhanced chemical vapor deposition (PECVD). However, PECVD deposits one or more materials via ion bombardment, which is a directional process. As device sizes continue to shrink, plasma characteristics, such as directional ion bombardment, may fail to deposit materials with sufficient quality on vertically extending portion of a feature. This is particularly evident when utilizing silicon containing materials on sidewalls of features. Deposited materials with poorer than desired quality may be less resistant to etch operations than material deposited on a horizontally extending surface of the features being filled. The poorer quality material at the sidewalls may be etched faster than other materials, resulting in uneven material across the feature previously filled. In addition, the poorer quality material is unable to fully merge with the higher quality material, forming seams and voids that are prone to hole distortion and shorting.

Attempts have been made to overcome these deficiencies by utilizing deposition and post deposition treatments, such as high temperature deposition, high temperature annealing, and the like. However, such deposition and post deposition treatments failed to provide adequate sidewall quality. In addition, efforts have been made to remove the vertically extending portion between respective deposition operations to retain only the high quality material. These treatments require a substantial decrease in throughput, or transfer to a secondary chamber, which is not feasible in modern processes.

The present technology has surprisingly found that by carefully tailoring the process, a silicon rich soaking operation may provide enhanced crosslinking and bonding to the film formed on one or more sidewalls. For example, the post-deposition operations may reorganize bonds in the material to provide a higher quality material. The present technology may overcome the natural tendency of the material deposited at the sidewalls to be poorer quality than the material deposited closer to the middle of the features. This may allow film formation at both horizontally and vertically extending sides of the respective feature without requiring removal of the sidewall film. Moreover, the film may exhibit relatively even film qualities and a reduced tendency to form seams and gaps.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may be used to perform deposition processes according to embodiments of the present technology before additional details according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including formation of stacks of semiconductor materials described herein in addition to plasma-enhanced chemical vapor deposition (PECVD), atomic layer deposition (ALD), physical vapor deposition (PVD), etch, pre-clean, degas, orientation, and other substrate processes including, annealing, ashing, etc.

The substrate processing chambers 108*a-f* may include one or more system components for depositing, annealing, curing and/or etching a dielectric or other film on the substrate. In one configuration, two pairs of the processing chambers, e.g., 108*c-d* and 108*e-f*, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
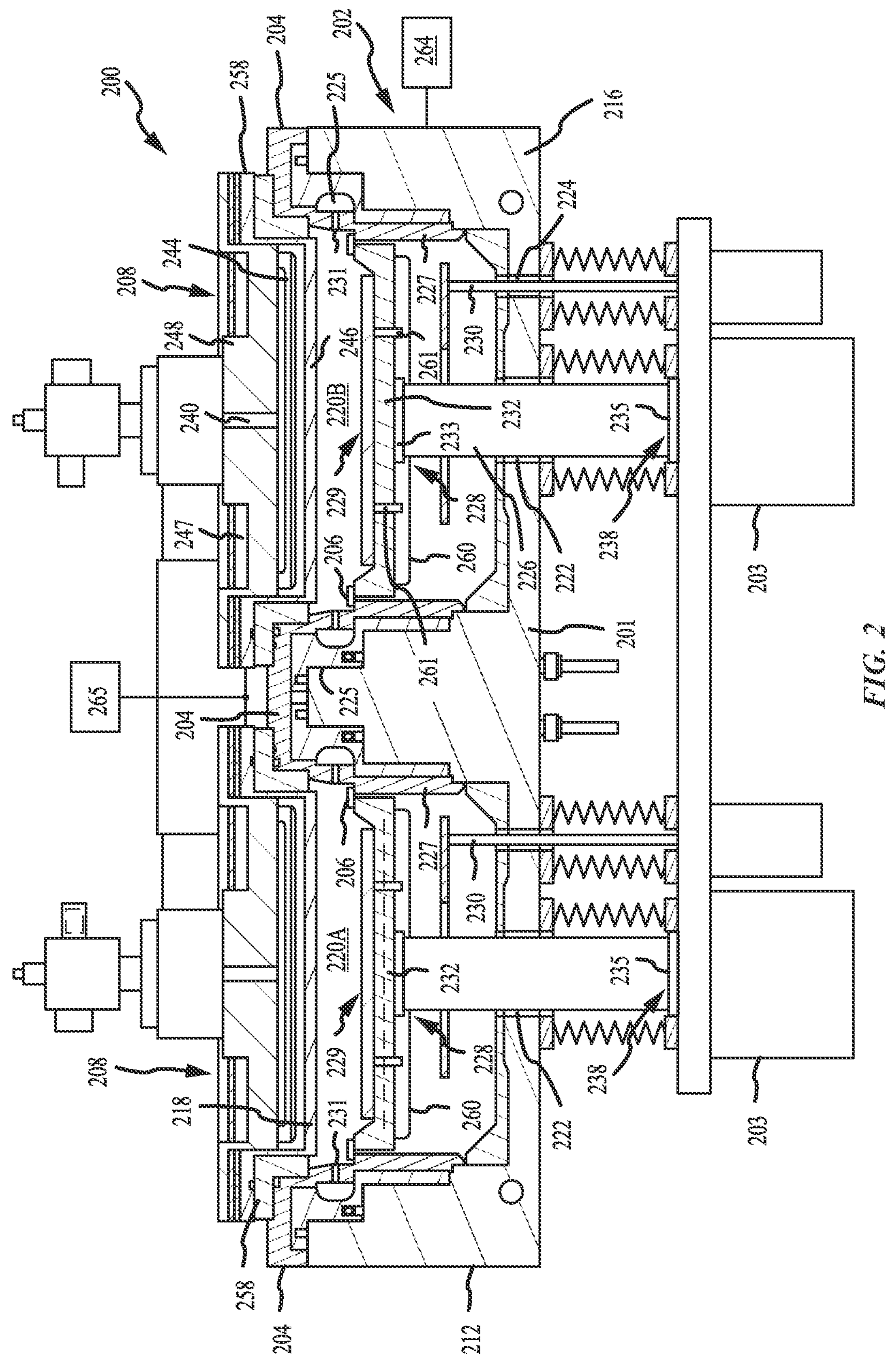
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include lid stack components according to embodiments of the present technology, and as may be explained further below. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. The dual-channel showerhead 218 and/or faceplate 246 may include one or more openings to permit the flow of precursors from the precursor distribution system 208 to the processing regions 220A and/or 220B. In some embodiments, the openings may include at least one of straight-shaped openings and conical-shaped openings. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the precursor distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
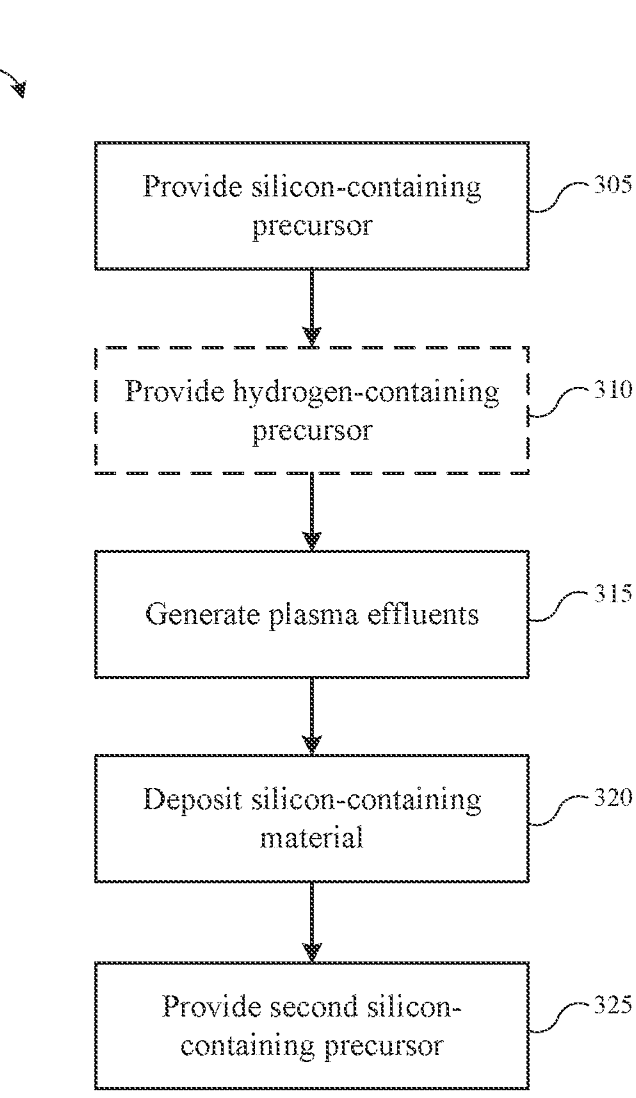
FIG. 3 shows operations of an exemplary semiconductor processing method according to some embodiments of the present technology.

FIG. 3 shows exemplary operations of a semiconductor processing method 300 according to some embodiments of the present technology. The method 300 may be performed in a variety of processing chambers, including processing system 200 described above, as well as in any other chamber in which the operations may be performed. Method 300 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Method 300 may include additional operations prior to initiation of the listed operations. For example, additional processing operations may include forming structures on a semiconductor substrate, which may include both forming and removing material. Prior processing operations may be performed in the chamber in which method 300 may be performed, or processing may be performed in one or more other processing chambers prior to delivering the substrate into the semiconductor processing chamber in which method 300 may be performed. Regardless, method 300 may optionally include delivering a semiconductor substrate to a processing region of a semiconductor processing chamber, such as processing chamber 200 described above, or other chambers that may include components as described above. The substrate may be positioned on a substrate support, such as pedestal 228, and which may reside in a processing region of the chamber, such as processing region 220 described above. Method 300 describes operations shown schematically in FIGS. 4A-4C, the illustrations of which will be described in conjunction with the operations of method 300. It is to be understood that FIGS. 4A-4C illustrate only partial schematic views of an exemplary structure 400, and a substrate 405 may contain any number of additional materials and features having a variety of characteristics and aspects as illustrated in the figures.

Figure 4A:
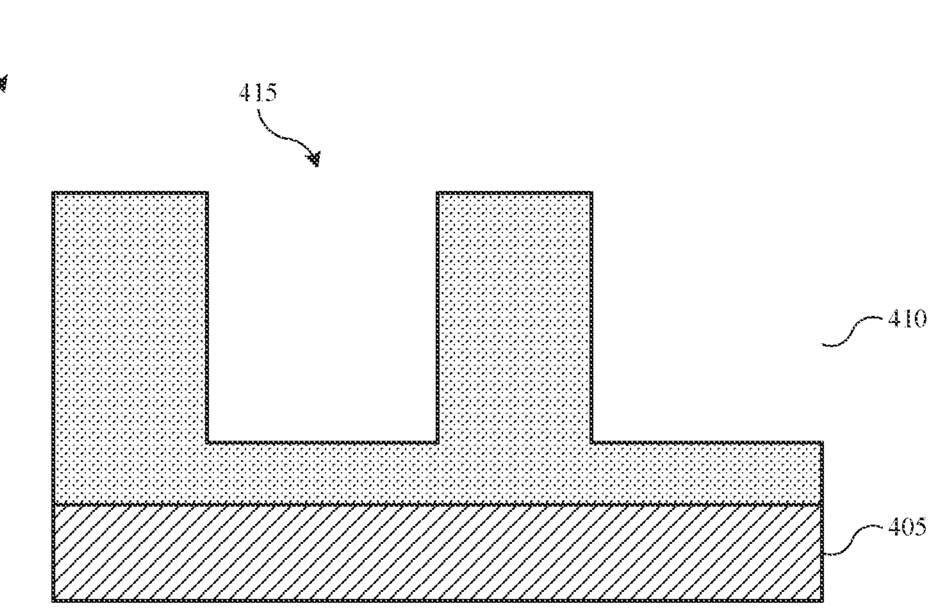
FIGS. 4A-4C show exemplary schematic cross-sectional structures in which material layers are included and produced according to some embodiments of the present technology.
Figure 4B:
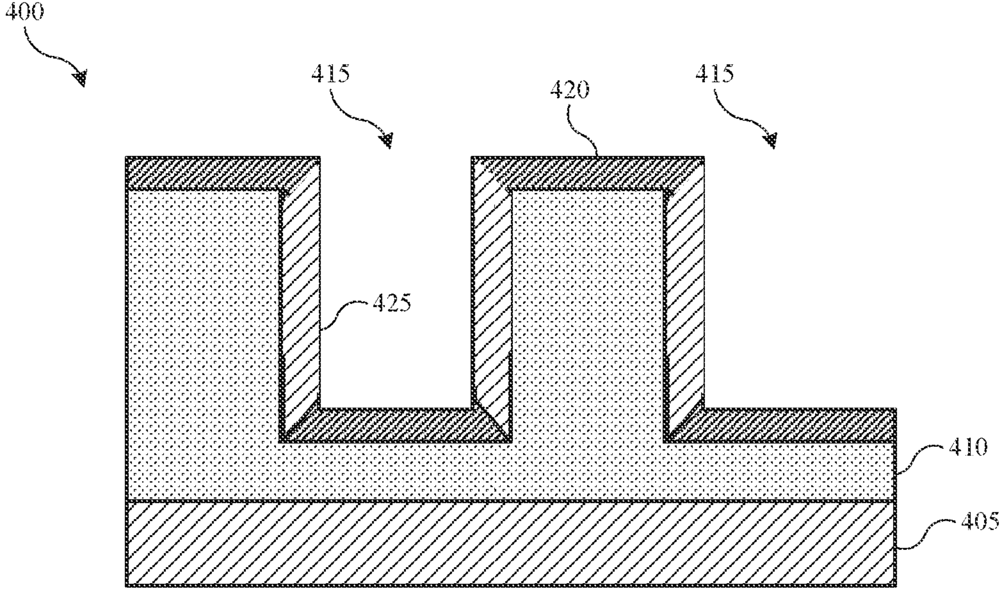
Figure 4C:
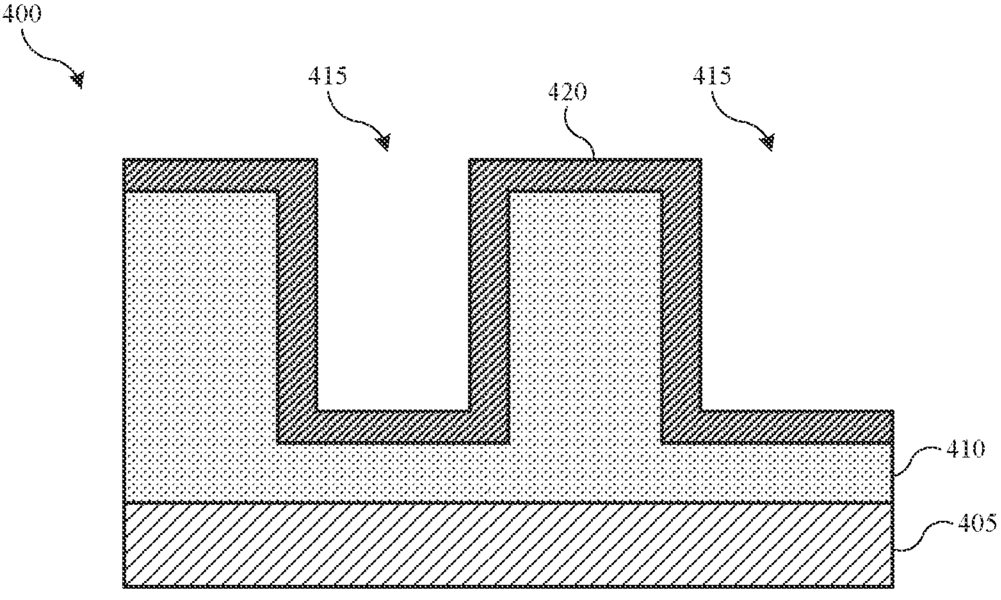

As shown in FIG. 4A, the substrate 405 may be any number of materials on which deposition may be performed. In embodiments, the substrate 405 may be a semiconductor substrate, including bulk substrates, epitaxially grown substrates, and/or silicon on insulator wafer. As used herein, the term "semiconductor substrate" refers to a substrate in which the entirety of the substrate is comprised of a semiconductor material. The semiconductor substrate may include any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon wafers, patterned or non-patterned wafers, doped silicon, germanium, gallium arsenide, or other suitable semiconducting materials. In embodiments, the semiconductor material is silicon (Si). In one or more embodiments, the semiconductor substrate 300 includes a semiconductor material, e.g., silicon (Si), carbon (C), germanium (Ge), silicon germanium (SiGe), germanium tin (GeSn), other semiconductor materials, or any combination thereof. In one or more embodiments, the substrate 302 includes one or more of silicon (Si), germanium (Ge), gallium (Ga), arsenic (As), or phosphorus (P). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In embodiments, the semiconductor material may be a doped material, such as n-doped silicon (n-Si), or p-doped silicon (p-Si). In embodiments, the substrate may be doped using any suitable process such as an ion implantation process. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. Nonetheless, in embodiments, the substrate 405 may be or include silicon, germanium, dielectric materials including silicon oxide or silicon nitride, metal materials, or any number of combinations of these materials, which may be the substrate, or materials formed on the substrate.

A number of materials may be formed over the substrate 405. For example, a material 410 may be formed over the substrate 405. As depicted, the material 410 may include a feature 415. The aspect ratio of the feature 415, or the ratio of the depth of the feature relative to the width or diameter of the feature formed, may be greater than or about 1:1, and may be greater than or about 2:1, than or about 3:1, greater than or about 4:1, greater than or about 5:1, greater than or about 6:1, greater than or about 7:1, greater than or about 8:1, greater than or about 9:1, greater than or about 10:1, greater than or about 25:1, greater than or about 50:1, or more. Although two features 415 are shown, it is to be understood that exemplary structures may have any number of features 415 defined along the structure according to embodiments of the present technology. In embodiments, structure 400 may be a 3D NAND structure.

Method 300 may include deposition processing operations, such as PECVD operations, to form silicon-containing materials on substrates with increased material quality specifically on sidewalls of the features. Method 300, as shown in FIG. 3, may include flowing one or more precursors into the semiconductor processing chamber at operation 305, which may deliver the precursor or precursors into a processing region of the semiconductor processing chamber where a substrate, such as substrate 405, may be housed, for example.

In embodiments, the precursor delivered at operation 305 may be or include a silicon-containing precursor. Silicon-containing precursors that may be used in operation 305 of method 300 may be or include any number of silicon-containing precursors. For example, the silicon-containing precursor may be or include silane ($SiH_4$), disilane ($Si_2H_6$), trisilane ($Si_3H_8$), silicon tetrachloride ($SiCl_4$), tetraethyl orthosilicate (TEOS), or any other precursor able to form a silicon-containing material such as, for example, a silicon oxide (SiO) material. Although higher-order silanes may be used in embodiments of the present technology, the increased hydrogen content in the material as deposited may lead to outgassing in subsequent operations.

At optional operation 310, method 300 may include providing a hydrogen-containing precursor to the processing region. In embodiments, the hydrogen-containing precursor may be provided with the silicon-containing precursor. The hydrogen-containing precursor and the silicon-containing precursor may be mixed prior to being provided to the processing region. However, it is contemplated that the hydrogen-containing precursor and the silicon-containing precursor may be kept isolated prior to being provided to the processing region. Hydrogen-containing precursors that may be used in optional operation 310 of method 300 may be or include any number of hydrogen-containing precursors. For example, the hydrogen-containing precursor may be or include molecular hydrogen ($H_2$), steam ($H_2O$), or any other precursor useful in forming a silicon-containing material such as, for example, a silicon oxide (SiO) material.

The precursors provided at operations 305 and/or 310 may also include any number of carrier gases, which may include nitrogen, helium, argon, or other noble, inert, or useful precursors. The carrier gases may be used to dilute the silicon-containing precursor or the hydrogen-containing precursor, which may reduce deposition rates to allow adequate control of the deposition. However, it is contemplated that the precursors may be provided without any other gases.

In embodiments, a flow rate of the hydrogen-containing precursor may impact the deposition of silicon-containing material. Higher flow rates of the hydrogen-containing precursor may incorporate additional hydrogen in the deposited material, which as previously discussed may lead to outgassing in subsequent operations. Accordingly, the hydrogen-containing precursor may make up less than or about 5% of a total flow of precursors provided to the processing region, such as less than or about 4.5% of the total flow of precursors, less than or about 4%, less than or about 3.5%, less than or about 3%, less than or about 2.5%, less than or about 2%, less than or about 1.5%, less than or about 1%, or less. By providing the hydrogen-containing precursor at operation 310, the energy of a subsequently formed plasma discussed below may increase. Additionally, the hydrogen may readily travel through the deposited material and may remove dangling bonds from the material. The removal of dangling bonds a may allow for increased Si—O bonding and, therefore, higher quality silicon-containing material to remain on the substrate 405.

The precursors delivered to the processing region, such as the silicon-containing precursor alone or in combination with the hydrogen-containing precursor, may be used to generate a plasma within the processing region of the semiconductor processing chamber at operation 315 of method 300. The plasma may be generated by, for example, providing RF power to the faceplate to generate a plasma within processing region 220, although any other processing chamber capable of producing plasma may similarly be used. In embodiments, the plasma may be generated at a frequency greater than or about 15 MHz. Although lower frequency may be used, in some embodiments the higher frequency plasma generation may densify the plasma and, therefore, densify the deposited material, unlike lower plasma frequency operations. Accordingly, the plasma may be generated at a frequency greater than or about 17 MHz, greater than or about 19 MHz, greater than or about 21 MHZ, greater than or about 23 MHZ, greater than or about 25 MHZ, greater than or about 27 MHz, or higher.

Additionally, a plasma power may be maintained at less than or about 1000 W while generating plasma effluents of the silicon-containing precursor and plasma effluents of the hydrogen-containing precursor. Accordingly, the plasma power may be maintained at less than or about 900 W, less than or about 800 W, less than or about 700 W, less than or about 600 W, less than or about 500 W, less than or about 450 W, less than or about 400 W, less than or about 350 W, less than or about 300 W, less than or about 250 W, less than or about 200 W, less than or about 150 W, less than or about 100 W, or less.

As shown in FIG. 4B, at operation 320, method 300 may include depositing a silicon-containing material 420 on the substrate 405. The silicon-containing material 420 may be deposited conformally on the substrate 405, such as in the feature 415. In some embodiments, the deposition rate may exceed 500 Å/min, and may exceed greater than or about 700 Å/min, greater than or about 1,000 Å/min, greater than or about 1,200 Å/min, greater than or about 1,400 Å/min, greater than or about 1,600 Å/min, greater than or about 1,800 Å/min, greater than or about 2,000 Å/min. By incorporating a hydrogen-containing precursor in some embodiments, additional energy may be added to the generated plasma.

In embodiments, the semiconductor processing chamber, the pedestal, or the substrate 405 may be maintained at a temperature greater than or about 250° C., and in some embodiments may be maintained at a temperature that is greater than or about 300° C., greater than or about 320° C., greater than or about 340° C., greater than or about 360° C., greater than or about 380° C., greater than or about 400° C., greater than or about 420° C., greater than or about 440° C., greater than or about 460° C., greater than or about 480° C., greater than or about 500° C., greater than or about 520° C., greater than or about 540° C., greater than or about 560° C., greater than or about 580° C., or more. Higher temperatures may result in a higher quality silicon-containing material 420 being deposited with increased Si—O bond formation. However, thermal budget constraints may require the semiconductor processing chamber, the pedestal, or the substrate 405 to be maintained at lower temperatures. Accordingly, in some embodiments, the semiconductor processing chamber, the pedestal, or the substrate 305 may be maintained at a temperature less than or about 600° C., and in some embodiments may be maintained at a temperature that is less than or about 580° C., less than or about 560° C., less than or about 540° C., less than or about 520° C., less than or about 500° C., or less.

During the deposition of the silicon-containing material 420, the semiconductor processing chamber may be maintained at any pressure suitable for forming silicon-containing material. For example, a pressure within the semiconductor processing chamber is maintained at less than or about 30 Torr, and in some embodiments may be maintained at a pressure that is less than or about 28 Torr, less than or about 26 Torr, less than or about 24 Torr, less than or about 22 Torr, less than or about 20 Torr, less than or about 18 Torr, less than or about 16 Torr, less than or about 14 Torr, less than or about 12 Torr, less than or about 10 Torr, less than or about 8 Torr, less than or about 6 Torr, less than or about 4 Torr, less than or about 2 Torr, or less.

However, as illustrated, in embodiments, a vertically formed portion of silicon-containing material 420, referred to herein as vertically extending film portion 425, may have a lower quality than the remainder of silicon-containing material 420. Moreover, in addition to problems such as differences in etch rate between vertically extending film portion 425 and silicon-containing material 420, the vertically extending film portion 425 may also form seams and gaps at an interface between the silicon-containing material 420 and the vertically extending film portion 425.

Surprisingly, the present technology has found that by carefully soaking the formed film, a difference in oxide quality can be reduced, or even eliminated, and also reduce and/or eliminate gaps and seams formed during deposition. As illustrated in FIG. 4C, such a post-deposition operation 325 may result in an even film over both vertical and horizontal portions of feature 415 with little to no evidence of seams and gaps. Thus, in embodiments method 300 includes performing a post-deposition treatment on the silicon-containing material 420 at operation 325 after deposition to a sufficient film thickness. While various film thicknesses are contemplated herein, in embodiments, films may exhibit less improvement from chemical soaking operation 325 if a film has too large of a thickness. Thus, in embodiments, the film of silicon-containing material 420 may be deposited at a thickness of less than or about 15 micrometers, such as less than or about 12.5 micrometers, such as less than or about 10 micrometers, such as less than or about 9 micrometers, such as less than or about 8 micrometers, such as less than or about 7 micrometers, such as less than or about 6 micrometers, such as less than or about 5 micrometers, or any ranges or values therebetween.

Nonetheless, operation 325 includes flowing one or more second silicon-containing precursors at soaking operation 325. In embodiments, any silicon-containing precursor may be utilized for the chemical soaking operation 325. In embodiments, the silicon-containing precursor may be or include silane ($SiH_4$), disilane ($Si_2H_6$), trisilane ($Si_3H_8$), silicon tetrachloride ($SiCl_4$), tetraethyl orthosilicate (TEOS), trisillylamine (TSA), octadecylcyclotetraoxane (OMTCS), tetramethylsilane (TMS), methyldiethoxysilane (DEMS), dimethyldimethoxysilane (DMDMOS), combinations thereof, as well as any other precursor able to form a silicon-containing material such as, for example, a silicon oxide (SiO) material.

The one or more second silicon-containing precursors may be flowed at a rate of greater than or about 10 sccm, such as greater than or about 25 sccm, such as greater than or about 50 sccm such as greater than or about 75 sccm, such as greater than or about 100 sccm, such as greater than or about 250 sccm, such as greater than or about 500 sccm, such as greater than or about 750 sccm, such as greater than or about 1000 sccm, such as greater than or about 1500 sccm such as greater than or about 2000 sccm, such as greater than or about 2500 sccm such as greater than or about 3000 sccm, such as greater than or about 3500 sccm such as greater than or about 4000 sccm, such as greater than or about 4500 sccm, such as greater than or about 5000 sccm, such as greater than or about 5500 sccm, such as greater than or about 6000 sccm such as greater than or about 6500 sccm, such as greater than or about 7000 sccm, such as greater than or about 7500 sccm, such as greater than or about 8000 sccm, such as greater than or about 8500 sccm, such as greater than or about 9000 sccm, such as greater than or about 9500 sccm, such as greater than or about 10,000 sccm, such as greater than or about 25,000 sccm, such as greater than or about 50,000 sccm, such as greater than or about 75,000 sccm, such as up to about 100,000 sccm, or any ranges or values therebetween.

In embodiments, the chemical soaking plasma may utilize a plasma, such as a plasma generated at a frequency greater than or about 55 MHz. Although lower frequency may be used, in some embodiments the higher frequency plasma generation may densify the plasma and, therefore, densify the deposited material, unlike lower plasma frequency operations. Accordingly, the plasma may be generated at a frequency greater than or about 15 MHZ, greater than or about 25 MHZ, greater than or about 30 MHz, greater than or about 35 MHZ, greater than or about 40 MHZ, greater than or about 45 MHz, such as greater than or about or higher or about 50 MHZ, such as greater than or about 75 MHZ, such as up to about 100 MHz, or any ranges or values therebetween. However, in embodiments, it should be clear that the soaking operation may not require forming a plasma and may include flowing a silicon-containing precursor.

Additionally, a chemical soaking plasma power may be maintained at less than or about 1000 W while generating plasma effluents of the silicon-containing precursor and plasma effluents of the hydrogen-containing precursor. Accordingly, the plasma power may be maintained at less than or about 900 W, less than or about 800 W, less than or about 700 W, less than or about 600 W, less than or about 500 W, less than or about 450 W, less than or about 400 W, less than or about 350 W, less than or about 300 W, less than or about 250 W, less than or about 200 W, less than or about 150 W, less than or about 100 W, or less.

The present technology has found that soaking operation 325 may further increase the quality of the sidewall film if the soaking operation is conducted at elevated temperatures. Thus, in embodiments, soaking operation 325 is conducted at a temperature that is greater than or about 300° C., greater than or about 320° C., greater than or about 340° C., greater than or about 360° C., greater than or about 380° C., greater than or about 390° C., greater than or about 400° C., greater than or about 410° C., greater than or about 420° C., greater than or about 430° C., greater than or about 440° C., greater than or about 450° C., greater than or about 460° C., greater than or about 470° C., greater than or about 480° C., greater than or about 490° C., greater than or about 500° C., or such as less than or about 600° C., and in some embodiments may be maintained at a temperature that is less than or about 580° C., less than or about 560° C., less than or about 540° C., less than or about 520° C., less than or about 500° C., or any ranges or values therebetween. Namely, by utilizing the temperature ranges discussed herein, increased crosslinking may be exhibited during chemical soaking 325, improving the quality of vertically extending film 425.

Moreover, the present technology has found that soaking operation 325 may further increase the quality of the sidewall film if the soaking operation is conducted at one or more pressures discussed herein. Namely, in embodiments, soaking operation 325 may be conducted at a pressure of about 5 torr to about 350 torr, such as greater than or about 6 torr, such as greater than or about 7 torr, such as greater than or about 8 torr, such as greater than or about 9 torr, such as greater than or about 10 torr, such as greater than or about 15 torr, such as greater than or about 20 torr, such as greater than or about 25 torr, such as greater than or about 50 torr, such as greater than or about 75 torr, such as greater than or about 100 torr, such as greater than or about 125 torr, such a greater than or about 150 torr, such as greater than or about 175 torr, such as greater than or about 200 torr, such as greater than or about 225 torr, such as greater than or about 250 torr, such as greater than or about 275 torr, such as up to about 300 torr, or such as less than or about 400 torr, such as less than or about 375 torr, such as less than or about 350 torr, such as less than or about 325 torr, such as less than or about 300 torr, or any ranges or values therebetween.

In embodiments, the chemical soaking 325 may impart excellent characteristics to vertically extending portion 425 without impacting throughput of the system if the soaking operation 325 is conducted for greater than or about 5 minutes, such as greater than or about 6 minutes, such as greater than or about 7 minutes, such as greater than or about 8 minutes, such as greater than or about 9 minutes such as greater than or about 10 minutes, such as greater than or about 12 minutes, such as greater than or about 14 minutes, such as greater than or about 16 minutes, such as greater than or about 18 minutes, such as greater than or about 20 minutes, such as greater than or about 22 minutes, such as greater than or about 24 minutes, such as greater than or about 26 minutes, such as greater than or about 28 minutes, such as up to about 30 minutes, or such as less than or about 60 minutes, such as less than or about 50 minutes, such as less than or about 40 minutes, such as less than or about 38 minutes, such as less than or about 36 minutes, such as less than or about 34 minutes, such as less than or about 32 minutes, such as less than or about 30 minutes, or any ranges or values therebetween. Moreover, the soaking process discussed herein may be conducted in the deposition chamber, and therefore not require transfer between process operations.

Stated differently, in embodiments, chemical soaking operation 325 may be operated for a period of time sufficient to increase an atomic percentage of silicon by greater than or about 0.5%, such as greater than or about 0.75%, such as greater than or about 1%, such as greater than or about 1.25%, such as greater than or about 1.5%, such as greater than or about 1.75%, such as greater than or about 2%, such as greater than or about 2.25%, such as greater than or about 2.5%, such as greater than or about 2.75%, such as greater than or about 3%, such as greater than or about 3.25%, such as greater than or about 3.5%, such as greater than or about 3.75%, such as greater than or about 4%, such as greater than or about 4.25%, such as greater than or about 4.5%, such as greater than or about 4.75%, such as greater than or about 5%, or such as less than or about 10%, such as less than or about 9%, such as less than or about 8%, such as less than or about 7%, such as less than or about 6%, such as less than or about 5.5%, such as less than or about 5%, or any ranges or values therebetween. In such a manner, sufficient silicon may be present to crosslink with other components, such as oxygen, nitrogen, or the like, improving the oxide quality of the vertically extending portion 425 without altering the film qualities of the remainder of silicon-containing material 420.

While not necessary in the present disclosure, as the soaked material may exhibit excellent film characteristics when formed herein, in embodiments, one or more optional post soaking operations may be conducted. For example, the post-soaking treatment may include exposing the silicon-containing material 420 to ultraviolet (UV) light. In some embodiments, the exposure to UV light may be performed in the semiconductor processing chamber used for the deposition of the silicon-containing material 420. In additional embodiments, the substrate 405 with the silicon-containing material 420 may be transferred to another semiconductor processing chamber where the UV light exposure operation is performed. The exposure to UV light may be performed in the presence of an oxygen-containing precursor or an inert precursor. For example, the oxygen-containing precursor may be any oxygen-containing material such as, for example, molecular oxygen ($O_2$) or ozone ($O_3$). The inert precursor may be any inert material such as, for example, argon, helium, or xenon.

In other embodiments, the post-soaking treatment may include annealing the silicon-containing material 420 on the substrate 405. In some embodiments, the annealing may be performed in the semiconductor processing chamber used for the deposition of the silicon-containing material 420. In additional embodiments, the substrate 405 with the silicon-containing material 420 may be transferred to another semiconductor processing chamber where the annealing is performed. The annealing may be performed in the presence of a hydrogen-containing precursor, a nitrogen-containing precursor, or an oxygen-containing precursor. The hydrogen-containing precursor may be any hydrogen-containing material such as, for example, molecular hydrogen ($H_2$). The nitrogen-containing precursor may be any nitrogen-containing material such as, for example, molecular nitrogen ($N_2$). The oxygen-containing precursor may be any oxygen-containing material such as, for example, molecular oxygen ($O_2$) or ozone ($O_3$).

Annealing the silicon-containing material 420 on the substrate 405 may result in outgassing of hydrogen and/or carbon from the silicon-containing material 420. For example, when annealing the silicon-containing material 420 in the presence of the oxygen-containing precursor, steam ($H_2O$) and/or carbon dioxide ($CO_2$) may outgas from the silicon-containing material 420. Additionally, when annealing the silicon-containing material 420 in the presence of the oxygen-containing precursor, additional oxygen may be imparted to the silicon-containing material, allowing for additional Si—O bonding. Similarly, when annealing the silicon-containing material 420 in the presence of the hydrogen-containing precursor, terminal hydroxyl (—OH) bonds by break from the silicon-containing material 420. The terminal-OH bonds may combine with the hydrogen-containing precursor and outgas as steam ($H_2O$). Regardless if any post-soaking operations are conducted, such operations may be conducted at lower temperatures and pressures than conventional treatments due to the improved film quality.

The present technology may reduce or greatly reduce both the average roughness and the range of roughness of the silicon-containing material 420. For example, the post-deposition treatment may modify a surface of the film by reorganizing bonds to reduce surface roughness conditions. In embodiments, the post-deposition treatment may increase Si—O bonding in the silicon-containing material 420 by greater than or about 3 at. %, such as greater than or about 4 at. %, greater than or about 5 at. %, greater than or about 6 at. %, greater than or about 7 at. %, greater than or about 8 at. %, or more.

Furthermore, films formed according to the present technology may have a more consistent etch rate, such as a wet etch rate, across the surface of the film. In conventional systems, a vertically extending portion may have an etch rate that is three to four times higher than a horizontally extending portion. Conversely, in embodiments, a vertically extending portion of silicon containing material 420 according to the present technology may have an etch rate that is less than or about 100% faster than an etch rate of a horizontally extending portion of silicon containing material 420, such as less than or about 90%, such as less than or about 80%, such as less than or about 70%, such as less than or about 60%, such as less than or about 50%, such as less than or about 40%, such as less than or about 30%, such as less than or about 20%, such as less than or about 10%, such as less than or about 9%, such as less than or about 8%, such as less than or about 7%, such as less than or about 6%, such as less than or about 5%, such as less than or about 4%, such as less than or about 3%, such as less than or about 2%, such as less than or about 1%, or any ranges or values therebetween.

In addition, after soaking operation 325, the void percentage in the silicon-containing material 420, such as voids formed by seams and gaps (measured as a volume percentage of voids as compared to a total volume of the silicon-containing material 420), may be reduced by greater than or about 20%, such as greater than or about 30%, such as greater than or about 40%, such as greater than or about 50%, such as greater than or about 60%, such as greater than or about 70%, such as greater than or about 80%, such as greater than or about 90%, such as greater than or about 95%, such as greater than or about 97.5%, such as greater than or about 99%, or any ranges or values therebetween.

By producing silicon-containing materials according to embodiments of the present technology, hardness and modulus of the silicon-containing material may be higher than would otherwise occur with conventional PECVD deposition methods. For example, in some embodiments, the present technology may produce materials characterized by a Young's modulus of greater than or about 60 Gpa, such as greater than or about 65 Gpa, greater than or about 70 Gpa, greater than or about 75 Gpa, greater than or about 80 Gpa, greater than or about 85 Gpa, greater than or about 90 Gpa, or more.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a material" includes a plurality of such materials, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:

providing a silicon-containing precursor to a processing region of a semiconductor processing chamber, wherein a substrate comprising one or more features is housed within the processing region of the semiconductor processing chamber;

generating plasma effluents of the silicon-containing precursor in the processing region;

depositing a silicon-containing material on a vertically extending portion of the one or more features and a horizontally extending portion of the one or more features;

soaking the silicon-containing material with a second silicon-containing precursor;

wherein the soaking occurs for a time sufficient to increase an atomic percentage of silicon in the vertically extending portion of the silicon-containing material by greater than or about 0.5%.

2. The semiconductor processing method of claim 1, wherein the second silicon-containing precursor comprises silane ($SiH_4$), disilane ($Si_2H_6$), trisilane ($Si_3H_8$), silicon tetrachloride ($SiCl_4$), tetraethyl orthosilicate (TEOS), trisillylamine (TSA), octadecylcyclotetraoxane (OMTCS), tetramethylsilane (TMS), methyldiethoxysilane (DEMS), dimethyldimethoxysilane (DMDMOS), or a combination thereof.

3. The semiconductor processing method of claim 1, wherein the soaking occurs for a time sufficient to increase an atomic percentage of silicon in the vertically extending portion of the silicon-containing material by greater than or about 2.5%.

4. The semiconductor processing method of claim 1, wherein a temperature in the semiconductor processing chamber is maintained at greater than or about 360° C. during the soaking.

5. The semiconductor processing method of claim 4, wherein the temperature in the semiconductor processing chamber is maintained about 380° C. to about 500° C. during the soaking.

6. The semiconductor processing method of claim 1, wherein a pressure in the semiconductor processing chamber is maintained at a pressure of from about 5 torr to about 350 torr during the soaking.

7. The semiconductor processing method of claim 1, wherein the soaking is performed for about 5 minutes to about 40 minutes.

8. The semiconductor processing method of claim 1, wherein a void percentage in the silicon-containing material on the vertically extending portion, based upon a total volume of the silicon-containing material on the vertically extending portion, is decreased by greater than or about 5 vol. % after soaking.

9. The semiconductor processing method of claim 1, wherein the vertically extending portion comprises a first etch rate and the horizontally extending portion comprises a second etch rate, wherein the first etch rate is less than or about 10% higher than the second etch rate after soaking.

10. The semiconductor processing method of claim 9, wherein the first etch rate and the second etch rate are wet etch rates.

11. A semiconductor processing method comprising:

providing a silicon-containing precursor to a processing region of a semiconductor processing chamber, wherein a substrate comprising one or more features is housed within the processing region of the semiconductor processing chamber;

generating plasma effluents of the silicon-containing precursor in the processing region;

depositing a silicon-containing material on a vertically extending portion of the one or more features and a horizontally extending portion of the one or more features;

providing plasma effluents of a second silicon-containing precursor in the processing region, increasing an atomic percentage of silicon in the vertically extending portion of the silicon-containing material by greater than or about 0.5%.

12. The semiconductor processing method of claim 11, wherein the silicon-containing material is deposited on the horizontally extending portion, the vertically extending portion, or both, at a thickness of less than or about 10 micrometers.

13. The semiconductor processing method of claim 11, wherein a temperature in the semiconductor processing chamber is maintained about 380° C. to about 500° C. when providing plasma effluents of the second silicon-containing precursor.

14. The semiconductor processing method of claim 11, wherein a pressure in the semiconductor processing chamber is maintained at a pressure of from about 5 torr to about 350 torr when providing plasma effluents of the second silicon-containing precursor.

15. The semiconductor processing method of claim 11, wherein providing plasma effluents of the second silicon-containing precursor is performed for about 5 minutes to about 40 minutes.

16. The semiconductor processing method of claim 11, further comprising etching the substrate after providing plasma effluents of the second silicon-containing precursor.

17. A semiconductor processing method comprising:

providing a silicon-containing precursor to a processing region of a semiconductor processing chamber, wherein a substrate comprising one or more features is housed within the processing region of the semiconductor processing chamber;

generating plasma effluents of the silicon-containing precursor in the processing region;

depositing a silicon-containing material on a vertically extending portion of the one or more features and a horizontally extending portion of the one or more features;

providing plasma effluents of a second silicon-containing precursor in the processing region at a temperature of about 380° C. to about 500° C., a pressure of from about 5 torr to about 350 torr, a time of about 5 minutes to about 40 minutes, or a combination thereof, soaking the silicon-containing material with the second silicon-containing precursor, increasing an atomic percentage of silicon in the vertically extending portion of the silicon-containing material by greater than or about 0.5%.

18. The semiconductor processing method of claim 17, wherein the silicon-containing material is deposited on the horizontally extending portion, the vertically extending portion, or both, at a thickness of less than or about 10 micrometers.

19. The semiconductor processing method of claim 17, wherein the second silicon-containing precursor comprises silane ($SiH_4$), disilane ($Si_2H_6$), trisilane ($Si_3H_8$), silicon tetrachloride ($SiCl_4$), tetraethyl orthosilicate (TEOS), trisillylamine (TSA), octadecylcyclotetraoxane (OMTCS), tetramethylsilane (TMS), methyldiethoxysilane (DEMS), dimethyldimethoxysilane (DMDMOS), or a combination thereof.

* * * * *